United States Patent
Taniguchi

(10) Patent No.: US 7,516,859 B2
(45) Date of Patent: Apr. 14, 2009

(54) OVERHEAD TRAVELING VEHICLE HAVING LATERAL MOVEMENT MECHANISM

(75) Inventor: Hiroto Taniguchi, Inuyama (JP)

(73) Assignee: Murata Machinery, Ltd., Kyoto-shi (JP)

(*) Notice: Subject to any disclaimer, the term of this patent is extended or adjusted under 35 U.S.C. 154(b) by 0 days.

(21) Appl. No.: 11/945,603

(22) Filed: Nov. 27, 2007

(65) Prior Publication Data
US 2008/0128376 A1    Jun. 5, 2008

(30) Foreign Application Priority Data
Nov. 27, 2006    (JP)    ............... 2006-318044

(51) Int. Cl.
*B66C 19/00*    (2006.01)
(52) U.S. Cl. ............... 212/332; 74/89.22; 212/331; 414/282
(58) Field of Classification Search ............... 414/940, 414/282; 212/331, 332; 74/89.22
See application file for complete search history.

(56) References Cited

U.S. PATENT DOCUMENTS

| | | | | |
|---|---|---|---|---|
| 3,010,328 A | * | 11/1961 | Forey | ............... 74/110 |
| 5,103,686 A | * | 4/1992 | Rosenquist | ............... 74/89.2 |
| 5,405,232 A | * | 4/1995 | Lloyd et al. | ............... 414/280 |
| 5,460,475 A | * | 10/1995 | Lloyd et al. | ............... 414/659 |
| 5,839,873 A | * | 11/1998 | Lloyd et al. | ............... 414/280 |
| 6,199,490 B1 | * | 3/2001 | Langer | ............... 108/143 |
| 2004/0149672 A1 | * | 8/2004 | Motoori et al. | ............... 212/332 |
| 2006/0222479 A1 | * | 10/2006 | Shiwaku et al. | ............... 414/267 |

FOREIGN PATENT DOCUMENTS

| | | |
|---|---|---|
| JP | 11180505 A | 7/1999 |
| JP | 2000-255710 A | 9/2000 |
| JP | 2001-130713 A | 5/2001 |
| JP | 2005206371 A | 8/2005 |
| JP | 2006-044920 A | 2/2006 |
| JP | 2006-168880 A | 6/2006 |

* cited by examiner

*Primary Examiner*—Thomas J. Brahan
(74) *Attorney, Agent, or Firm*—Westerman, Hattori, Daniels & Adrian, LLP.

(57) ABSTRACT

An overhead traveling vehicle has a lateral movement mechanism for moving a transfer apparatus toward left and right sides. The lateral movement mechanism includes a fixed base unit having drive means, and a middle unit supported by the base unit. The middle unit is slidable laterally by the drive means toward both of the left and right sides and is provided at an intermediate position below the base unit. The mechanism has further a front unit supporting the transfer apparatus, and being supported by the middle unit. The front unit is slidable laterally, moves with the movement of the middle unit, and is provided at a front end position below the middle unit.

3 Claims, 7 Drawing Sheets

OVERHEAD TRAVELING VEHICLE HAVING LATERAL MOVEMENT MECHANISM

TECHNICAL FIELD

The present invention relates to an overhead traveling vehicle. In particular, the present invention relates to a technique of moving a transfer apparatus mounted in the overhead traveling vehicle toward both of the left and right sides.

BACKGROUND ART

According to the disclosure of Japanese Laid-Open Patent Publication No. 2005-206371, a transfer apparatus of an overhead traveling vehicle moves toward one of the left and right sides of a traveling direction for allowing an article to be transferred between the transfer apparatus and a buffer provided on a side of a travel rail, i.e., a side buffer. In Japanese Laid-Open Patent Publication No. 2005-206371, though the transfer apparatus can move the transfer apparatus only one of the left and right sides, if it is possible to move the transfer apparatus toward both of the left and right sides, for example, the following advantages can be obtained.
(1) It is possible to additionally provide side buffers, in particular, at a position above processing equipment or the like.
(2) It is possible use a side buffer at the center by overhead traveling vehicles on the left and right sides of the side buffer.

For this purpose, it is necessary to increase the length of the stroke, assuming that directions of the lateral moment are both directions to the left and right. However, a mechanism required for achieving movement to the directions to the left and the right is complicated. Further, since high rigidity is required for the long stroke, the thickness of the mechanism for lateral movement (hereinafter referred to as the "lateral drive") is increased. As a result, the size (height) and the weight of the overhead traveling vehicle are increased disadvantageously.

DISCLOSURE OF THE INVENTION

Problems to be Solved by the Invention

An object of the present invention is to make it possible to move an article toward both of the left and right sides of a traveling direction of an overhead traveling vehicle using a compact mechanism having a lightweight.

Another object of the present invention is to reduce dust emission from a lateral drive.

Still another object of the present invention is to provide specific structure for moving a transfer apparatus laterally by a large stroke.

Means for Solving the Problems

An overhead traveling vehicle according to the present invention includes:
a lateral movement mechanism for moving a transfer apparatus for an article toward left and right sides of a traveling direction;
the lateral movement mechanism including:
a fixed base unit having drive means;
a middle unit supported by the base unit, the middle unit being slidable laterally, and movable by the drive means toward both of the left and right sides, the middle unit being provided at an intermediate position below the base unit;
a front unit supporting the transfer apparatus, the front unit being supported by the middle unit and being slidable laterally, the front unit moving laterally following lateral movement of the middle unit, the front unit being provided at a front end position below the middle unit.

Further, according to the present invention, in a method of moving a transfer apparatus of an overhead traveling vehicle toward left and right sides of a traveling direction of the overhead traveling vehicle by a lateral movement mechanism provided in the overhead traveling vehicle, the lateral movement mechanism includes a fixed base unit having drive means, a middle unit provided below the base unit, and a front unit provided below the middle unit.

The method includes the steps of:
supporting the middle unit by the base unit, and sliding the middle unit relative to the base unit, toward both of the left and right sides; and
supporting the front unit by the middle unit, laterally moving the front unit following lateral movement of the middle unit, and supporting the transfer apparatus by the front unit.

Preferably, a drive pulley as the drive means is provided in the base unit, the drive pulley driving a belt has both ends fixed to the middle unit for allowing the middle unit to move toward both of the left and right sides. A pair of belts each having one end fixed to the front unit and another end fixed to the base unit are provided. One of the pair of belts is folded back by an idler pulley provided in the middle unit at a position outside an end of the belt on a base unit side in a lateral direction, the other of the pair of belts is folded back by an idler pulley provided in the middle unit at a position outside an end of the belt on a front unit side in the lateral direction, for allowing the front unit to move laterally following lateral movement of the middle unit.

Further, preferably, a rail in the base unit and a rail in the middle unit are provided in parallel, between the base unit and the middle unit, a first linear guide guided by the two rails is provided for guiding the middle unit by the base unit. Further, a rail in the middle unit and a rail in the front unit are provided in parallel, between the middle unit and the front unit, and a second linear guide guided by the two rails is provided for guiding the front unit by the middle unit.

ADVANTAGES OF THE INVENTION

In the present invention, in comparison with the case of using an arm such as a scara arm, with a compact and highly rigid mechanism having a lightweight, it is possible to move the transfer apparatus toward both of the left and right sides.

In the case of using the drive pulley as drive means provided in the base unit to drive the belt having both ends fixed to the middle unit, and moving a pair of belt each having one end fixed to the front unit and the other end fixed to the base unit, using the idler pulley provided in the middle unit at a position outside both fixed ends of the belts, it is possible to easily move the front unit toward both of the left and right sides of the front unit by a large stroke. Further, in comparison with the case of using chains, dust emission is reduced.

In the case of using a linear guide guided by the rail provided in the base and the rail provided in the middle unit to guide the middle unit, and using a linear guide guided by the rail provided in the middle unit and the rail provided in the front unit to guide the front unit by the middle unit, it is possible to reliably to move the transfer apparatus laterally by a large stroke.

DESCRIPTION OF THE NUMERALS

Figure 1:
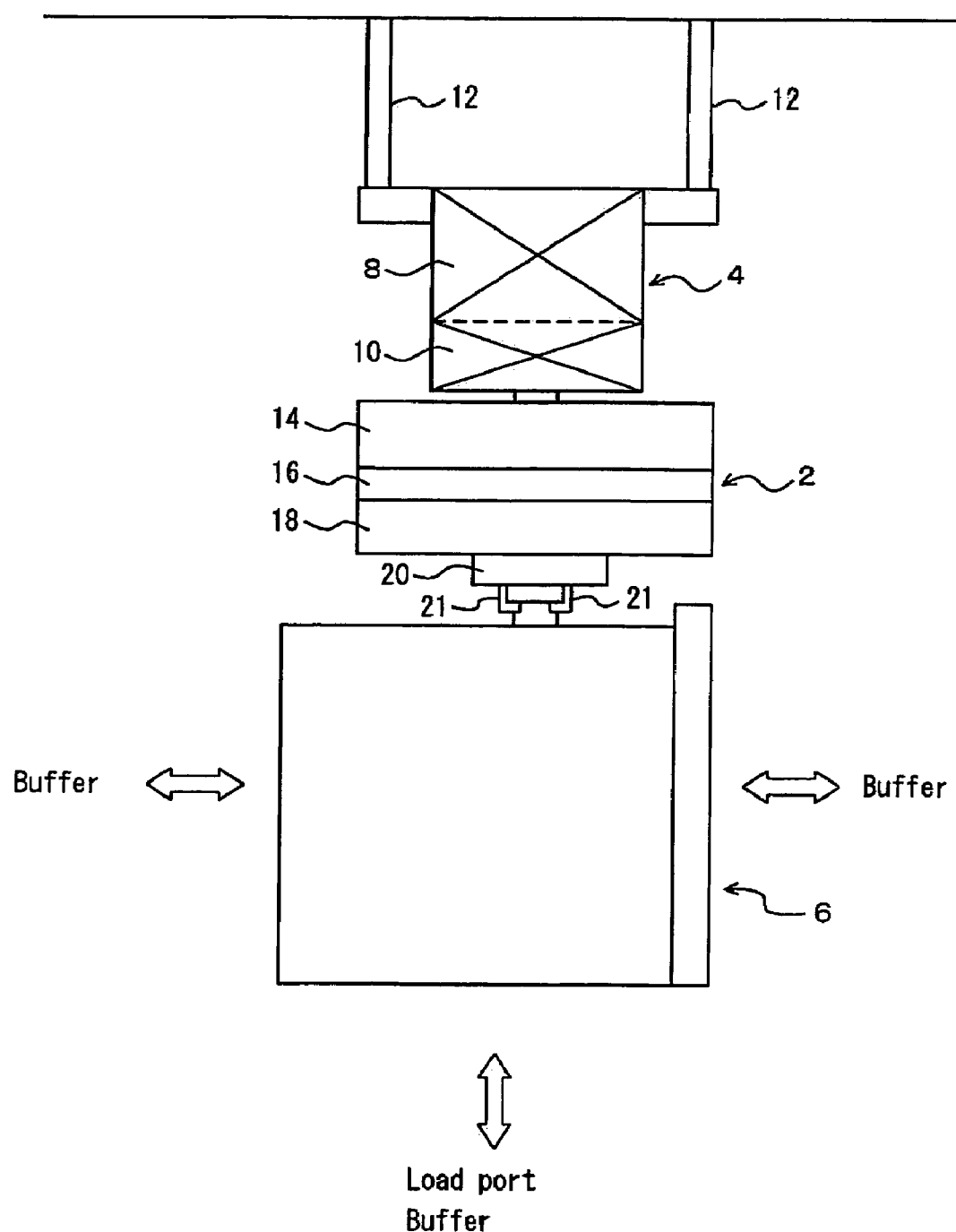
FIG. 1 is a front view showing an overhead traveling vehicle according to an embodiment.

2: overhead traveling vehicle
4: rail
6: cassette
8: travel rail
10: power feeding rail
12: support column
14: lateral drive
16: θ drive
18: elevation drive
20: elevation frame
21: chuck
22: base unit
24: middle unit
26: front unit
28: drive pulley
30, 38, 39: idler pulley
32, 36, 37: toothed belt
34, 35: fixed end
40 to 43: fixed end
50 to 53: rail
54, 55: linear guide
57: stopper
60 to 63: linear guide
70, 71: rail
72: roller

EMBODIMENTS

FIGS. 1 to 7 shows an overhead traveling vehicle 2 according to an embodiment and its modified embodiments. In the drawings, a reference numeral 4 denotes a rail provided near a ceiling of, e.g., a clean room. A reference numeral 6 denotes a cassette as a transported article, e.g., containing a semiconductor wafer or the like. The rail 4 includes a travel rail 8 and a power feeding rail 10. The rail 4 is supported from the ceiling by support columns 12 or the like.

The overhead traveling vehicle 2 has a travel unit inside the travel rail 8, and a pick up unit inside the power feeding rail 10 for receiving electricity. A reference numeral 14 denotes a lateral drive for moving a θ drive 16, an elevation drive 18, and an elevation frame 20 toward both of the left and right sides of a traveling direction of the travel rail 8. In the specification, a direction perpendicular to the traveling direction of the travel rail 8 is referred to as the lateral direction. Further, unless specifically noted, the traveling direction means a direction along the travel rail 8. The θ drive 16 moves the elevation drive 18 and the elevation frame 20 in a horizontal plane. The θ drive 16 may not be provided. The elevation drive 18 elevates, and lowers the elevation frame 20. The cassette 6 is suspended by chucks 21 which can be opened and closed on the elevation frame 20.

The lateral drive 14 of the overhead traveling vehicle 2 can move the cassette 6 toward both of the left and right sides of the traveling direction. Thus, buffers, racks, conveyors, stations or the like can be provided on both of the left and right sides. Thus, by elevation of the elevation frame 20, it is possible to transfer the cassette 6 to and from a load port for the processing apparatus or a buffer below the travel rail 8.

Figure 2:
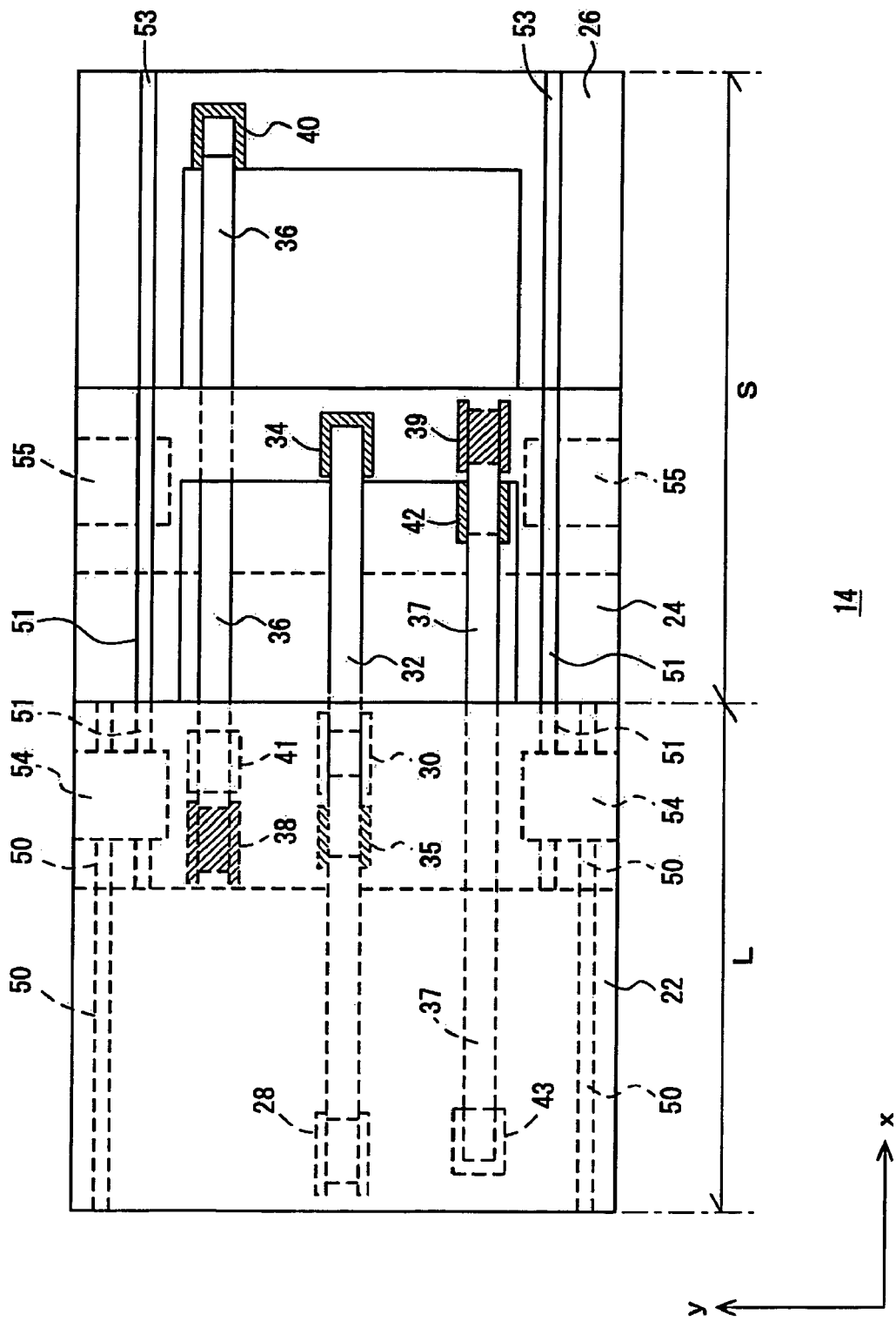
FIG. 2 is a view showing a drive mechanism of a lateral drive in the overhead traveling vehicle according to the embodiment.

FIG. 2 shows a drive mechanism of the lateral drive 14. Description will be given in the order from upper to lower components. A reference numeral 22 denotes a base unit as a member fixed at the base of the overhead traveling vehicle 2. A reference numeral 24 denotes a middle unit provided at an intermediate position. A reference numeral 26 denotes a front unit at the lowermost position. The front unit 26 moves toward both of the left and right sides of the traveling direction. Hereinafter, in the case where operation of the lateral drive 14 is described, the lateral direction is a direction indicated by "x" in FIG. 2, and the traveling direction is a direction indicated by "y" in FIG. 2. Further, a reference numeral S denotes a stroke for lateral movement of the front unit 26, and the stroke S is larger than the length L of the base unit 22 in the x direction. The base unit 22 has a drive motor (not shown). A reference numeral 28 denotes a drive pulley driven by the drive motor. A reference numeral 30 denotes an idler pulley, a reference numeral 32 denotes a toothed belt, and reference numerals 34, 35 denote fixed ends. The driven pulley 28 and the idler pulley 30 are provided in the base unit 22, and the fixed ends 34, 35 are provided in the middle unit 24. One end of the toothed belt 32 is fixed at the fixed end 34. The toothed belt 32 is folded back at the pulley 28, and folded back again at the pulley 30. The other end of the toothed belt 32 is fixed at the fixed end 35. By rotation of the driven pulley 28, the middle unit 24 moves toward both of the left and right sides of the base unit 22.

Reference numerals 36, 37 denote a pair of toothed belts. Reference numerals 38, 39 denote idler pulleys. Reference numerals 40 to 43 denote fixed ends. The idler pulleys 38, 39 are provided in the middle unit 24, the fixed ends 40, 42 are provided in the front unit 26, and the fixed ends 41, 43 are provided in the base unit 22. By these components, by a stroke which is twice as large as the drive amount of the drive pulley 28, it is possible to move the front unit 26 laterally relative to the base unit 22. Further, instead of the toothed belts 32, 36, 37, flat belts or V-belts may be used.

Figure 3:
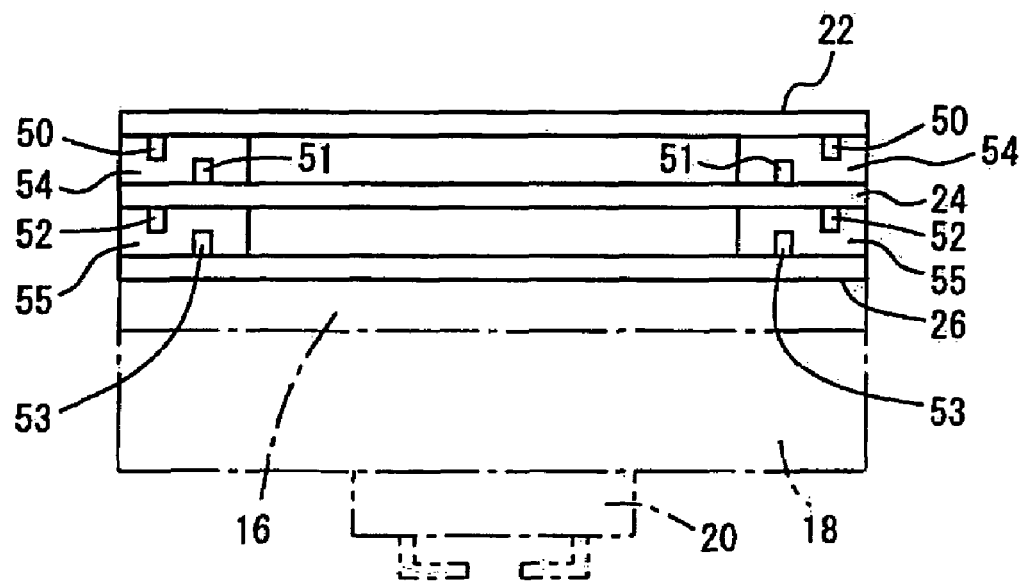
FIG. 3 is a view showing a guide mechanism of the lateral drive as viewed from the stretching direction of the drive in the overhead traveling vehicle according to the embodiment.

FIG. 3 schematically shows a state of the lateral drive 14 as viewed from the traveling direction in FIG. 2. The θ drive 16, the elevation drive 18, and the elevation frame 20 are supported below the front unit 26 of the lateral drive 14. For example, a pair of rails 50 are provided on both of the left and right sides of the base unit 22. For example, a pair of left and right rails 51 are provided on an upper surface of the middle unit 24. The rails 50, 51 are in parallel with each other. For example, a pair of linear guides 54 are guided by the two rails 50 and the two rails 51. For example, a pair of left and right rails 52 are provided on a lower surface side of the middle unit 24. Further, for example, a pair of rails 53 are provided on an upper surface of the front unit 26. The rails 52, 53 are in parallel with each other, and linear guides 55 guided by both of the two rails 52, and the two rails 53 are provided on the left and the right sides.

Figure 4:
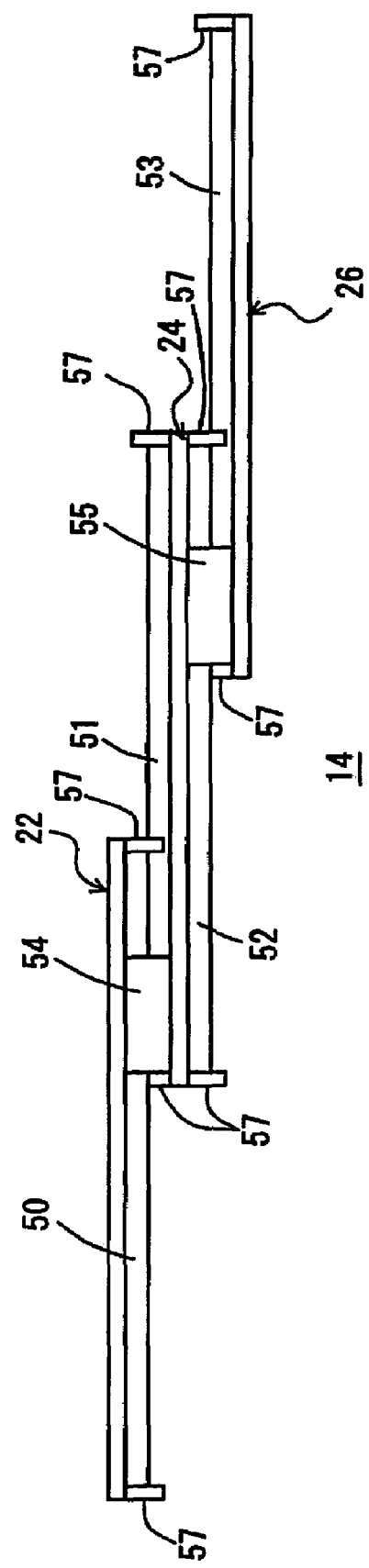
FIG. 4 is a view showing the guide mechanism of the lateral drive in a state in which a front unit is extended toward one of left and right sides in the overhead traveling vehicle according to the embodiment.
Figure 5:
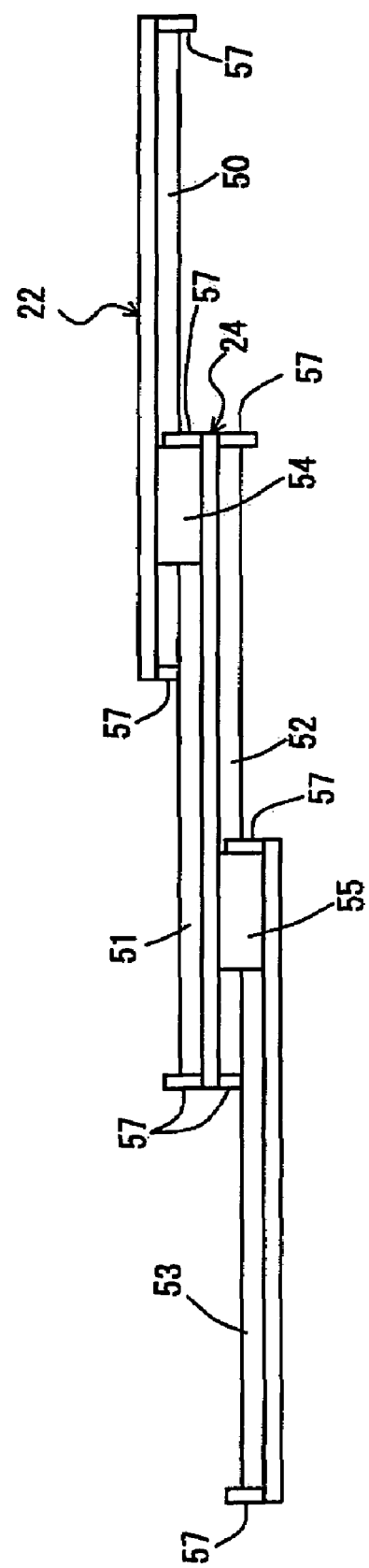
FIG. 5 is a view showing the guide mechanism of the lateral drive in a state in which the front unit is extended to the other of left and right sides in the overhead traveling vehicle according to the embodiment.

As shown in FIGS. 4 and 5, the linear guide 54 is provided between the rails 50, 51, and the linear guide 55 is provided between the rails 52, 53. In the arrangement, in the case of moving the front unit 26 laterally, it is possible to move the front unit 26 laterally by a large stroke. The stroke of the middle unit 24 is almost twice as large as the stroke of the linear guide 54. Further, the stroke of the front unit 26 relative to the middle unit 24 is almost twice as large of the stroke of the linear guide 55. Preferably, stoppers 57 are provided at both ends of the rails 50 to 53 for reliably preventing detachment of the linear guides 54, 55 from the rails 50 to 53. Though the linear guides 54, 55 are freely movable, when the middle unit 24 or the front unit 26 moves laterally, the linear guides 54, 55 are pressed by the stopper 57, and move laterally. In the case where the middle unit 24 and the front unit 26 do not move laterally, by the load of weights of the θ drive 16 and the elevation drive 18, the linear guides 54, 55 are fixed. In FIG. 3, the stoppers 57 are not shown. Although the embodiment has been described in connection with the case in which the pair of left and right linear guides 54, and the pair of left and right linear guides 55 are provided, the liner guides may be provided on one of the left and right sides, or provided only at the center of the lateral drive 14. In the case where the linear guides 54, 55 are provided only on one of the left and the right sides, preferably, for example, rails 70, 71 and a plurality of rollers 72 as shown in FIG. 7 are provided on the other side in the lateral direction for guiding movement of the middle unit 24 relative to the base unit 21, and guiding movement of the front unit 26 relative to the middle unit 24.

Figure 6:
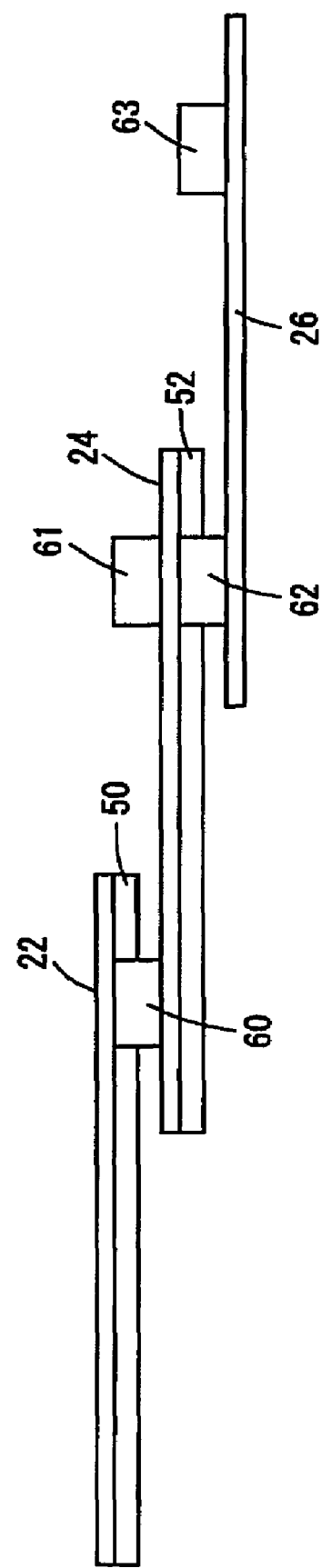
FIG. 6 is a view showing a guide mechanism of a lateral drive in an extended state in an overhead traveling vehicle according to a modified embodiment.

FIG. 6 shows guides for the middle unit 24 and the front unit 26 in a modified embodiment. For example, a pair of linear guides 60, 61 are provided on the middle unit 24 along a moving direction for guidance by the rail 50 of the base unit 22. Further, likewise, a pair of linear guides 62, 63 are provided on the front unit 26 along a direction in which the front unit 26 is advanced and retracted, for guidance by the rail 52. In this case, by lateral movement of the middle unit 24 and the front unit 26, one of a pair of guides 60, 61 is detached from the rail 50, and in the same manner, one of a pair of guides 62, 63 is detached from the rail 52. When the middle unit 24 and the front unit 26 move back to a position below the base unit 22, all of the guides 60 to 63 are supported by the rails 50, 52.

Figure 7:
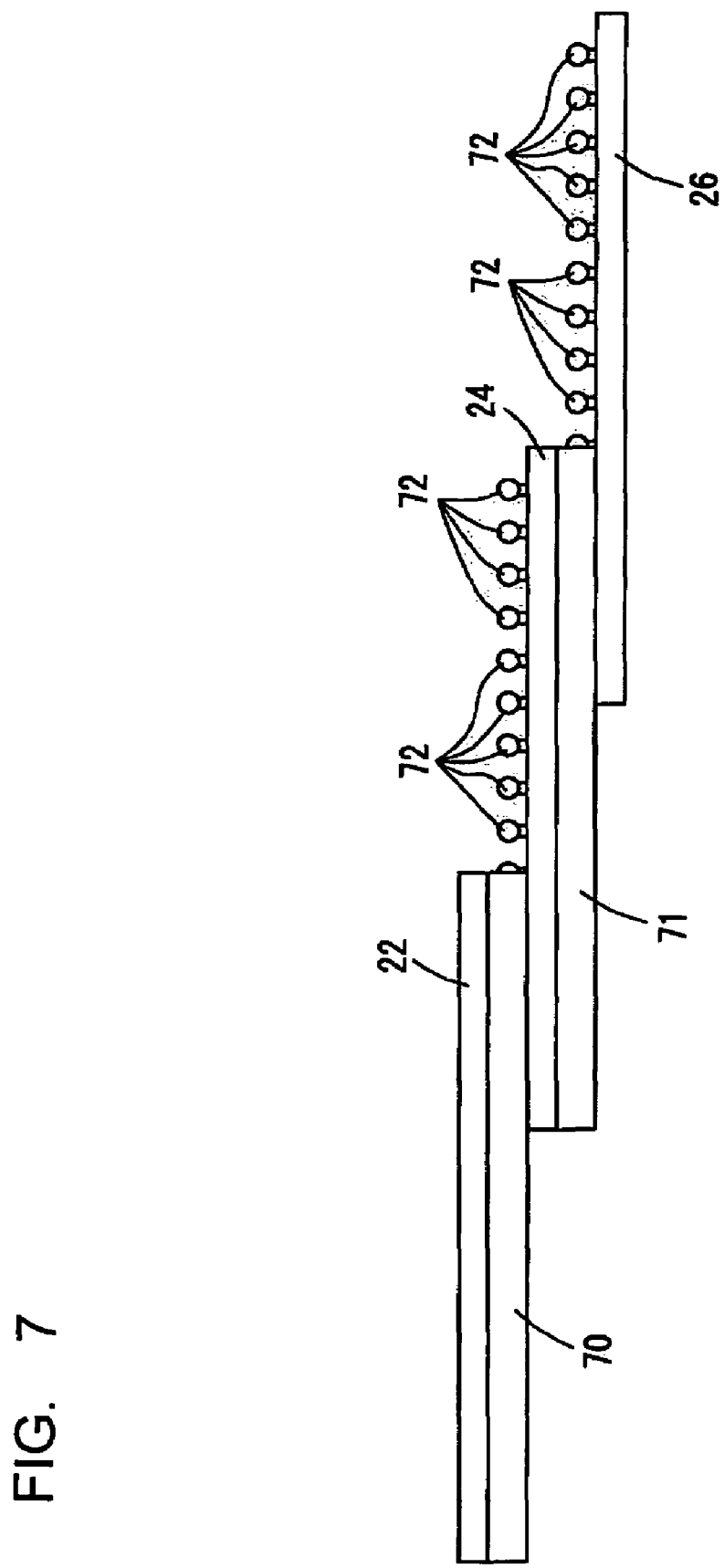
FIG. 7 is a view showing a guide mechanism of a lateral drive in an extend state in an overhead traveling vehicle according to a second modified embodiment.

FIG. 7 shows the guides according to a modified embodiment, using the rails 70, 71 and the rollers 72. The rollers 72 rotate along a guide surface (not shown) in the rail 70 for guiding the middle unit 24 relative to the base 22, and guiding the front unit 26 relative to the middle unit 24.

In the modified embodiment, the following advantages are obtained.

(1) In comparison with the case of rotating an arm such as a scara arm, it is possible to reduce the weight, size, and thickness of the lateral drive 14. Therefore, the weight and the size (height) of the overhead traveling vehicle 2 are reduced advantageously.

(2) It is possible to increase the stroke S of the front unit 26 in comparison with the length L of the base 22 in the x direction. Thus, it is possible to move the cassette 6 laterally by the large stroke.

(3) Since the toothed belts are used instead of chains, dust emission is reduced, and it is possible to move the cassette 6 with a high degree of accuracy.

(4) By using the linear guides 54, 55 in FIGS. 3 and 4, it is possible to easily move the front unit 26 laterally by the large stroke. Further, since the linear guide 54, 55 have the thickness equal to the thickness of normal linear guides, the thickness of the lateral drive 14 does not increase.

The invention claimed is:

1. An overhead traveling vehicle including:
   a lateral movement mechanism for moving a transfer apparatus for an article toward left and right sides of a traveling direction;
   the lateral movement mechanism including:
   a fixed base unit having drive means;
   a middle unit supported by the base unit, the middle unit being slidable laterally, and movable by the drive means toward both of the left and right sides, the middle unit being provided at an intermediate position below the base unit;
   a front unit supporting the transfer apparatus, the front unit being supported by the middle unit and being slidable in a lateral direction, the front unit being provided at a front end position below the middle unit;
   a first rail in the base unit and a second rail in the middle unit being provided in parallel between the base unit and the middle unit;
   a first freely moveable linear guide guided by the first and second rails being provided for guiding the middle unit by the base unit,
   a third rail in the middle unit and a fourth rail in the front unit being provided in parallel between the middle unit and the front unit; and
   a second freely moveable linear guide guided by the third and fourth rails being provided for guiding the front unit by the middle unit,
   wherein the second rail in the middle unit and the fourth rail in the front unit have stoppers at both ends respectively, and
   wherein the stoppers push and move the linear guides in accordance with the movement of the middle and front units.

2. The overhead traveling vehicle according to claim 1, a drive pulley as the drive means being provided in the base unit, the drive pulley driving a belt having both ends fixed to the middle unit for allowing the middle unit to move toward both of the left and right sides, and
   a pair of belts each having one end fixed to the front unit and another end fixed to the base unit being further provided, one of the pair of belts being folded back by an idler pulley provided in the middle unit at a position outside an end of the belt on a base unit side in a lateral direction, the other of the pair of belts being folded back by an idler pulley provided in the middle unit at a position outside an end of the belt on a front unit side in the lateral direction, for allowing the front unit to move laterally following lateral movement of the middle unit.

3. A method of moving a transfer apparatus of an overhead traveling vehicle toward left and right sides of a traveling direction of the overhead traveling vehicle by a lateral movement mechanism provided in the overhead traveling vehicle, the lateral movement mechanism including a fixed base unit having drive means, a middle unit provided below the base unit, and a front unit provided below the middle unit; the method including the steps of:

supporting the middle unit by the base unit, and sliding the middle unit relative to the base unit, toward both of the left and right sides; and supporting the front unit by the middle unit, laterally moving the front unit following the sliding of the middle unit; and supporting the transfer apparatus by the front unit, wherein a first freely moveable linear guide for guiding the middle unit by the base unit is guided by a first and a second guide rail, a second freely moveable linear guide for guiding the front unit by the middle unit is guided by a third and a fourth rail, and the second and fourth rails are provided with a stopper unit at both ends respectively, and wherein the stopper units push and move the first and second linear guides in accordance with the movement of the middle and front units.

* * * * *